US008829567B2

(12) United States Patent
Lee et al.

(10) Patent No.: US 8,829,567 B2
(45) Date of Patent: Sep. 9, 2014

(54) METAL ALLOY WITH AN ABRUPT INTERFACE TO III-V SEMICONDUCTOR

(71) Applicant: Sematech, Inc., Albany, NY (US)

(72) Inventors: Rinus Tek Po Lee, Austin, TX (US); Tae Woo Kim, Austin, TX (US); Man Hoi Wong, Austin, TX (US); Richard Hill, Austin, TX (US)

(73) Assignee: Sematech, Inc., Albany, NY (US)

(*) Notice: Subject to any disclaimer, the term of this patent is extended or adjusted under 35 U.S.C. 154(b) by 6 days.

(21) Appl. No.: 13/729,592

(22) Filed: Dec. 28, 2012

(65) Prior Publication Data

US 2014/0183597 A1      Jul. 3, 2014

(51) Int. Cl.
*H01L 21/02* (2006.01)
*H01L 21/00* (2006.01)
*H01L 29/205* (2006.01)

(52) U.S. Cl.
CPC .................................. *H01L 29/205* (2013.01)
USPC ............................................ 257/190; 438/48

(58) Field of Classification Search
CPC ....................................................... H01L 21/00
USPC ................. 257/189, 190, 200, 201, 614, 615, 257/E21.633, E21.634, E21.619, E21.618, 257/401, 351, 347, 194, 97, 98, 77; 438/603, 604, 930, 29, 22, 46, 47, 172, 438/32, 478, 34, 483, 759, 167, 169, 31, 91, 438/94, 98, 151, 164, 300
See application file for complete search history.

(56) References Cited

U.S. PATENT DOCUMENTS

| 4,011,583 | A | | 3/1977 | Levinstein et al. |
|---|---|---|---|---|
| 4,188,710 | A | | 2/1980 | Davey et al. |
| 4,889,831 | A | * | 12/1989 | Ishii et al. ..................... 438/508 |
| 5,039,578 | A | | 8/1991 | Appelbaum et al. |
| 5,077,599 | A | * | 12/1991 | Yano et al. ..................... 257/753 |
| 5,179,041 | A | * | 1/1993 | Yano et al. ..................... 438/605 |
| 7,935,632 | B2 | | 5/2011 | Tong et al. |
| 8,507,920 | B2 | * | 8/2013 | Chen et al. ..................... 257/76 |
| 2011/0089467 | A1 | * | 4/2011 | Chang et al. ................... 257/194 |
| 2011/0147798 | A1 | * | 6/2011 | Radosavljevic et al. ...... 257/194 |
| 2013/0001657 | A1 | * | 1/2013 | Cheng et al. ................... 257/288 |
| 2013/0001659 | A1 | * | 1/2013 | Cheng et al. ................... 257/288 |
| 2013/0009217 | A1 | * | 1/2013 | Yin et al. ........................ 257/288 |
| 2013/0056793 | A1 | * | 3/2013 | Srinivasan ..................... 257/183 |
| 2013/0286634 | A1 | * | 10/2013 | Lo et al. ......................... 362/97.1 |

OTHER PUBLICATIONS

Kim, S.H. et al., "Self-aligned Metal S/D InP MOSFETs using Metallic Ni—InP Alloys", 23$^{rd}$ *International Conference on Indium Phosphide and Related Materials—IPRM* 2011, (2011).

(Continued)

*Primary Examiner* — Chuong A Luu
*Assistant Examiner* — Sheikh Maruf
(74) *Attorney, Agent, or Firm* — Heslin Rothenberg Farley & Mesiti P.C.

(57) ABSTRACT

Semiconductor structures having a first layer including an n-type III-V semiconductor material and a second layer including an M(InP)(InGaAs) alloy, wherein M is selected from Ni, Pt, Pd, Co, Ti, Zr, Y, Mo, Ru, Ir, Sb, In, Dy, Tb, Er, Yb, and Te, and combinations thereof, are disclosed. The semiconductor structures have a substantially planar interface between the first and second layers. Methods of fabricating semiconductor structures, and methods of reducing interface roughness and/or sheet resistance of a contact are also disclosed.

19 Claims, 8 Drawing Sheets

(56) References Cited

OTHER PUBLICATIONS

Kim, SangHyeon, et al., "Self-Aligned Metal Source/Drain $In_xGa_{1-x}As$ n-Metal-Oxide-Semiconductor Field-Effect Transistor Using Ni—InGasAs Alloy", *The Japan Society of Applied Physics*, (2011).

Zhang, Xingui et al., "A Self-Aligned Ni—InGaAs Contact Technology for InGaAs Channel n-MOSFETs", *Journal of the Electrochemical Society*, vol. 159, pp. 511-515 (2012).

Mehari, S. et al., "Measurement of the Schottky Barrier Height Between Ni—InFaAs alloy and In0.53Ga0.47As", *Applied Physics Letters*, vol. 101 (2012).

* cited by examiner

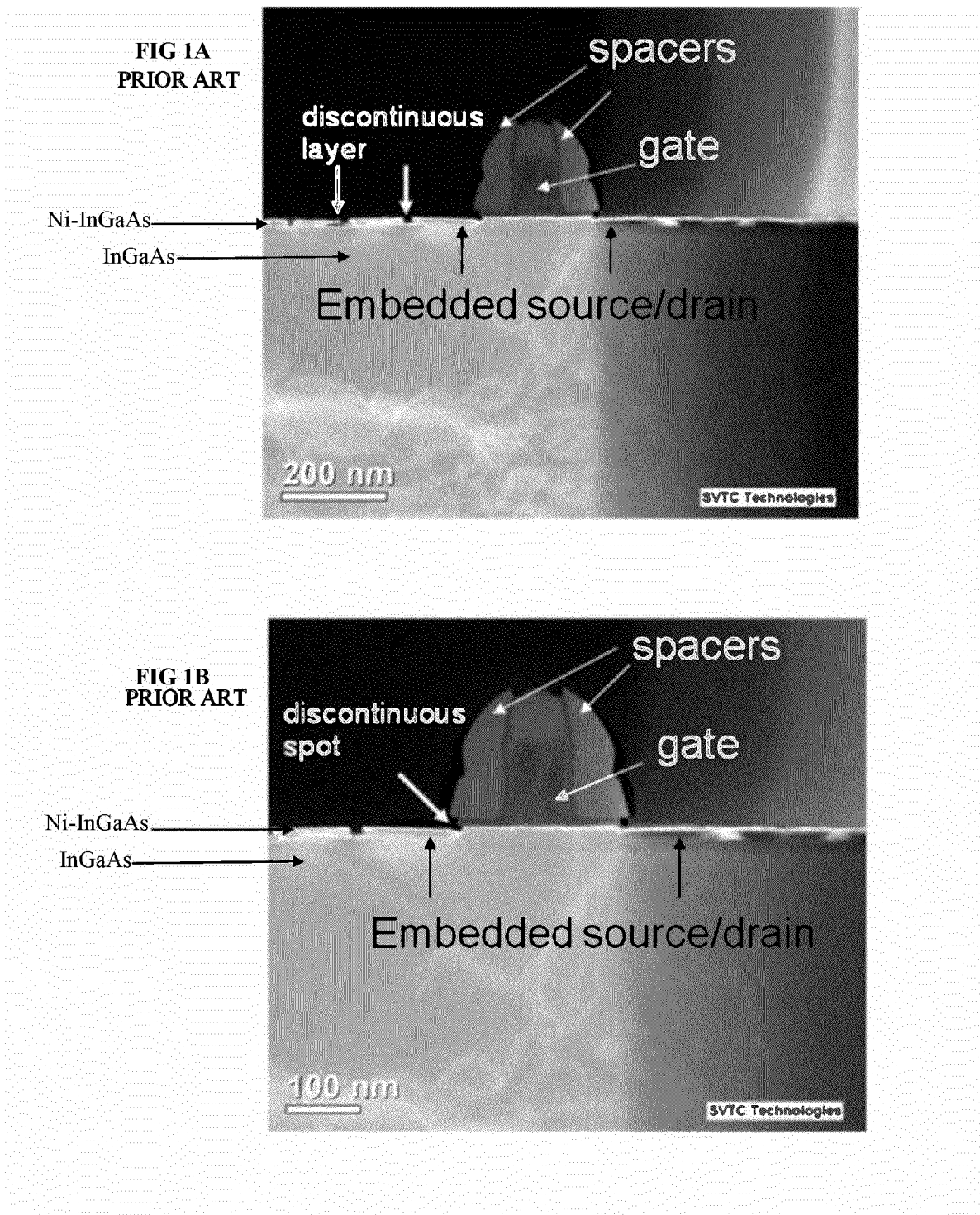

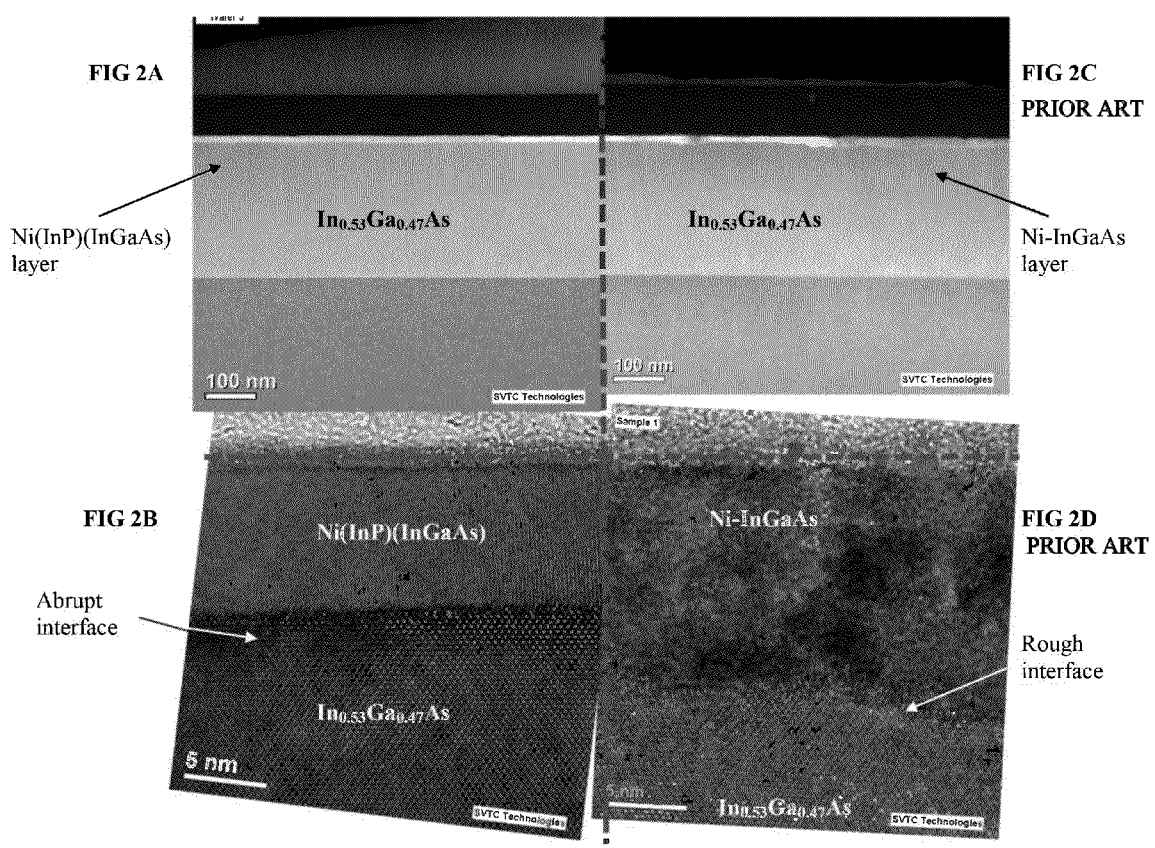

METAL ALLOY WITH AN ABRUPT INTERFACE TO III-V SEMICONDUCTOR

TECHNICAL FIELD

The invention relates to semiconductor structures, to methods of fabricating semiconductor structures, and to methods of reducing interface roughness and/or sheet resistance (sheet resistivity) of a contact at elevated temperatures.

BACKGROUND OF THE INVENTION

The use of III-V compound semiconductors has been widely explored as a means to improve integrated circuit performance.

Various metal layers have been used as semiconductor device contacts due to their good electrical properties and relatively high thermal stability. For example, a Ni—InGaAs source/drain contact scheme for III-V metal-oxide-semiconductor field effect transistors (MOSFET) has been developed. The Ni—InGaAs layer may be formed, for example, onto an exposed surface of source and drain regions in a semiconductor substrate. During an annealing process, atoms of the substrate in the source and drain regions react with the atoms of the deposited metal, thereby forming a layer. Portions of the un-reacted metal on insulating regions can be selectively removed. The remaining layer can reduce sheet resistance/sheet resistivity at the source/drain contact by helping to form a highly conductive metal layer on the semiconductor so that good electrical contact can be made.

As devices scale smaller, contact resistance generally increases. To facilitate implementation of III-V semiconductors, the practical matter of contacts with devices must be addressed to avoid, for example, increased parasitic resistance in series with source and drain regions as semiconductor structures are scaled down in size. This is particularly true because series resistance degrades device performance by, for example, decreasing drain current.

Thus, a need exists for improved semiconductor structures.

While certain aspects of conventional technologies have been discussed to facilitate disclosure of the invention, Applicants in no way disclaim these technical aspects, and it is contemplated that the claimed invention may encompass one or more of the conventional technical aspects discussed herein.

In this specification, where a document, act or item of knowledge is referred to or discussed, this reference or discussion is not an admission that the document, act or item of knowledge or any combination thereof was, at the priority date, publicly available, known to the public, part of common general knowledge, or otherwise constitutes prior art under the applicable statutory provisions; or is known to be relevant to an attempt to solve any problem with which this specification is concerned.

SUMMARY OF THE INVENTION

Briefly, the present invention satisfies the need for improved semiconductor structures. The present invention may address one or more of the problems and deficiencies of the art discussed above. However, it is contemplated that the invention may prove useful in addressing other problems and deficiencies in a number of technical areas. Therefore, the claimed invention should not necessarily be construed as limited to addressing any of the particular problems or deficiencies discussed herein.

In one aspect, the invention relates to a semiconductor structure. The semiconductor structure includes a first layer comprising an n-type III-V semiconductor material and a second layer comprising an M(InP)(InGaAs) alloy, wherein M is selected from Ni, Pt, Pd, Co, Ti, Zr, Y, Mo, Ru, Ir, Sb, In, Dy, Tb, Er, Yb, and Te, and combinations thereof. In the semiconductor structure, there is a substantially planar interface between the first and second layers.

In another aspect, the invention relates to a method of fabricating a semiconductor structure. The method includes providing a III-V semiconductor substrate, depositing an indium phosphide (InP) interlayer on the III-V semiconductor substrate, depositing a metal layer which includes one or more of Ni, Pt, Pd, Co, Ti, Zr, Y, Mo, Ru, Ir, Sb, In, Dy, Tb, Er, Yb, and Te on the InP interlayer, and annealing.

In another aspect, the invention relates to a method of reducing interface roughness and/or sheet resistance (sheet resistivity) ("$R_s$" or "$R_{sheet}$") of a contact at elevated temperatures. The reduced interface roughness leads to reduced leakage currents and/or contact resistance ($R_C$). The method includes providing a III-V semiconductor substrate, depositing an InP interlayer on the III-V semiconductor substrate, depositing a metal layer which includes one or more of Ni, Pt, Pd, Co, Ti, Zr, Y, Mo, Ru, Ir, Sb, In, Dy, Tb, Er, Yb, and Te and combinations thereof on the InP interlayer, and annealing.

In another aspect, the invention relates to an electronic device which comprises a semiconductor structure that includes a first layer comprising an n-type III-V semiconductor material and a second layer comprising M(InP)(InGaAs) alloy, wherein M is selected from Ni, Pt, Pd, Co, Ti, Zr, Y, Mo, Ru, Ir, Sb, In, Dy, Tb, Er, Yb, and Te, and combinations thereof. In the semiconductor structure, there is a substantially planar interface between the first and second layers.

Certain embodiments of the presently-disclosed semiconductor structures, methods of fabricating semiconductor structures, and methods of reducing interface roughness and/or sheet resistance (sheet resistivity) of a contact have several features, no single one of which is solely responsible for their desirable attributes. Without limiting the scope of these semiconductor structures and methods as defined by the claims that follow, their more prominent features will now be discussed briefly. After considering this discussion, and particularly after reading the section of this specification entitled "Detailed Description of the Invention," one will understand how the features of the various embodiments disclosed herein provide a number of advantages over the current state of the art. These advantages may include, without limitation, providing semiconductor structures that allow for improved device performance, for example, due to a substantially planar metal alloy/III-V semiconductor interface.

These and other features and advantages of this invention will become apparent from the following detailed description of the various aspects of the invention taken in conjunction with the appended claims and the accompanying drawings.

BRIEF DESCRIPTION OF THE DRAWINGS

FIGS. 1A-B are XTEM micrograph images of a semiconductor structure known in the art which, unlike the present invention, lacks a layer comprising a M(InP)(InGaAs) alloy.

FIGS. 2A-E are XTEM micrograph images of semiconductor structures. FIGS. 2A-B are semiconductor structures according to the present invention. FIGS. 2C-D are semiconductor structures known in the art. FIG. 2E depicts comparative micrograph images, with a micrograph image of a semiconductor structure according to the present invention shown under a micrograph image of a semiconductor structure known in the art.

FIG. 3A shows results for a semiconductor structure according to the present invention, fabricated using an InP interlayer. FIG. 3B shows results for a semiconductor structure lacking an InP interlayer.

FIGS. 5A-C are images of semiconductor structures according to the present invention, fabricated with a 5 nm InP interlayer, and with metal layers of varying thickness. FIG. 5D is an image of a semiconductor structure fabricated without an InP interlayer.

DETAILED DESCRIPTION OF THE INVENTION

Figure 2E:
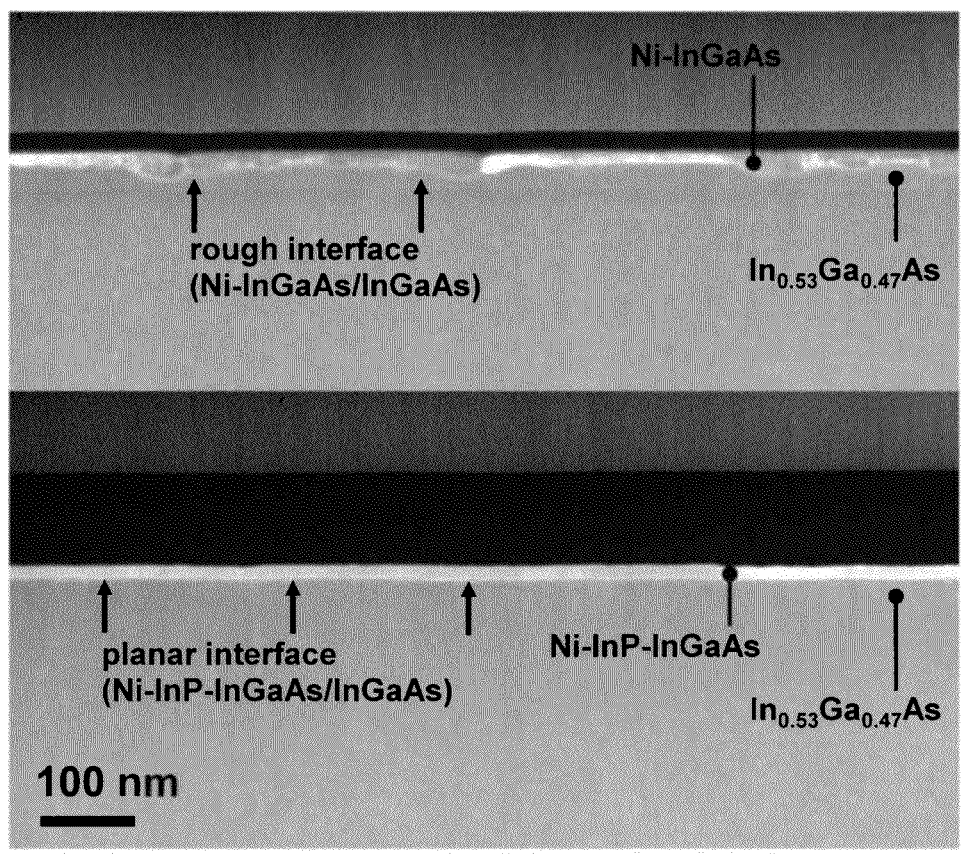

The present invention is generally directed to semiconductor structures, to methods of fabricating the semiconductor structures, and to methods of reducing contact resistance and/or sheet resistance of a contact.

In known III-V semiconductors having a metal interface, the interface is often rough, which can be detrimental to device performance. FIGS. 1A-B are XTEM micrograph images, at 200 nm scale and 100 nm scale, respectively, of a semiconductor structure known in the art which, unlike the present invention, lacks a layer comprising a M(InP)(InGaAs) alloy. The figures depict a white Ni—InGaAs alloy layer disposed over a gray InGaAs semiconductor material. As can be seen, the interface between the InGaAs and the Ni—InGaAs is rough and the Ni—InGaAs layer is discontinuous. Both the rough interface and the discontinuous metal alloy layer can lead to increased sheet resistance (sheet resistivity) and/or contact resistance ($R_C$), and/or leakage currents and can detrimentally affect series resistance and performance of devices comprising the semiconductor structure.

The semiconductor structures and methods of the present invention address the problem of unsatisfactory device performance due to rough interface between III-V semiconductor material and metal alloy layer, and/or due to a discontinuous metal alloy layer, by providing for an abrupt metal alloy/III-V semiconductor interface. The abrupt interface is achieved through the use of an InP interlayer between the III-V semiconductor material and the metal alloy layer. Thus, semiconductor structures and methods of the invention may be used for, inter alia, improved MOSFETs and non-planar and ultra-thin-body (UTB) devices (e.g., limited interfacial areas) for S/D contact optimization.

Although this invention is susceptible to embodiment in many different forms, certain embodiments of the invention are described. It should be understood, however, that the present disclosure is to be considered as an exemplification of the principles of this invention and is not intended to limit the invention to the embodiments illustrated In one aspect, the invention relates to a semiconductor structure which includes a first layer comprising an n-type III-V semiconductor material and a second layer comprising an M(InP)(InGaAs) alloy. M may represent, for example, Ni, Pt, Pd, Co, Ti, Zr, Y, Mo, Ru, Ir, Sb, In, Dy, Tb, Er, Yb, and Te, as well as combinations of any one or more thereof (for example, NiPt, etc.). In certain embodiments, the second layer is 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 nm thick, including any and all ranges and subranges therein (e.g., 2-50 nm, 3-40 nm, 4-30 nm, 5-25 nm, etc.).

III-V semiconductor materials are those comprising atoms of Group III elements and atoms of Group V elements. Examples of common III-V semiconductor materials are those which include GaAs, InP, InAs, GaP, InGaAs, InAlAs, InAlGa and GaInP Examples of other, less common binary and ternary III-V materials include: AlSb, GaSb, GaP, InSb, AlGaAs, GaAsP, InGaN. For some uses quaternary III-V materials, such as those including AlGaInP and InGaAsSb, can be employed. The binary, ternary and quaternary alloys of GaAs, InP, InAs and GaP are preferred. The InAs/GaAs ternary alloy can be characterized as $In_xGa_{1-x}As$ where x is the proportion of InAs and $_{1-x}$ is the proportion of GaAs. A convenient substrate for $In_xGa_{1-x}As$ is InP. Accordingly, InGaAs layers have been disposed over InP layers in semiconductor structures, but such structures differ from the present invention, where an InP interlayer is disposed over the III-V semiconductor material (e.g., the InGaAs), between the III-V material and a metal alloy layer, M(InP)(InGaAs). Since $In_xGa_{1-x}As$ with 53% InAs has the same lattice constant as InP, the combination leads to very high quality thin films, and $In_xGa_{1-x}As$ with 53% InAs is often called "standard InGaAs" without bothering to note the values of "$_x$" or "$_{1-x}$". When a specific sample of InGaAs is described in the experiments below, it will be standard InGaAs unless otherwise noted.

An n-type semiconductor material is a material which has been doped with dopant atoms capable of providing extra conduction electrons to the host material, thereby creating an excess of negative (n-type) electron charge carriers. Any acceptable n-type dopant atoms may be used. For example, in some embodiments, Si is used as an n-type dopant in InGaAs or other III-V semiconductor materials. Other acceptable dopants include, but are not limited to, S, Se, Te, Ge, Sn, O and combinations thereof.

Where semiconductor materials, layers, and structures are referred to throughout the disclosure and claims, the materials, layers, or structures may contain various dopants or other additives. Doping processes are well-known by persons having ordinary skill in the art, and any acceptable doping processes may be used in the fabrication of materials, layers, and substrates of the present invention. For example, dopants may be incorporated into semiconductor materials in various ways, including, but not limited to, MBE (molecular beam epitaxy), MOCVD (metalorganic chemical vapor deposition), MLD (monolayer deposition), and traditional ion implantation (I/I).

The semiconductor structures of the invention have a substantially planar interface between the first layer comprising an n-type III-V semiconductor material and the second layer comprising an M(InP)(InGaAs) alloy. As used herein, the term "substantially planar" means that there is an average deviation of less than 10% of the width of M(InP)(InGaAs) layer from linearity along the interface. For example, in FIG. 5A, the M(InP)(InGaAs) layer is 10 nm thick, and there is an average deviation of less than 1 nm from linearity along the interface of the M(InP)(InGaAs) layer and the III-V semiconductor material.

In some embodiments, there is an average deviation of less than 3 nm from linearity along the interface of the M(InP)(InGaAs) layer and the n-type III-V semiconductor material.

For example, in some embodiments, the average deviation is less than 2.5 nm, or less than 2 nm, or less than 1.5 nm, or less than 1 nm, or less than 0.8 nm.

In some embodiments, the first layer of the semiconductor structure of the present invention is an InGaAs layer, for example, a standard InGaAs layer. As described above, the InGaAs layer, or any other III-V semiconductor layer may be doped with any desirable dopant atom(s), including, but not limited to S, Se, Te, Ge, Sn, O and combinations thereof.

In some embodiments, the second layer of the semiconductor structure is a Ni(InP)(InGaAs) alloy, which may include any desirable dopant atom(s), including, but not limited to S, Se, Te, Ge, Sn, O and combinations thereof. The second layer may be of any desired thickness. In certain embodiments, the second layer is 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 nm thick, including any and all ranges and subranges therein (e.g., 2-50 nm, 3-40 nm, 4-30 nm, 5-25 nm, etc.).

The semiconductor structures of the present invention may comprise various other layers desirable to a person having ordinary skill in the art. In some embodiments, the semiconductor structure of the present invention includes an InP layer deposited under the III-V semiconductor material/layer.

In some embodiments, the semiconductor structure of the present invention has a III-V semiconductor material source structure and a III-V semiconductor drain structure. In some embodiments, the source and drain structures are embedded. In other embodiments, the source and drain structures are raised. In certain embodiments, the semiconductor structure comprises an InGaAs source structure and an InGaAs drain structure. In these embodiments, the source and drain structures may also comprise any desirable dopants, including, but not limited to, S, Se, Te, Ge, Sn, O and combinations thereof.

Figure 5A:
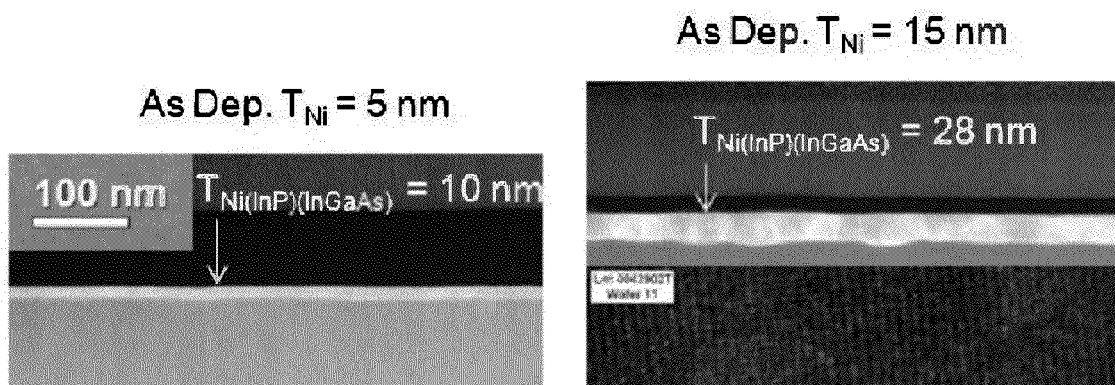
FIGS. 5A-D are XTEM micrograph images of metal/III-V interfaces in semiconductor structures.
Figure 5C:
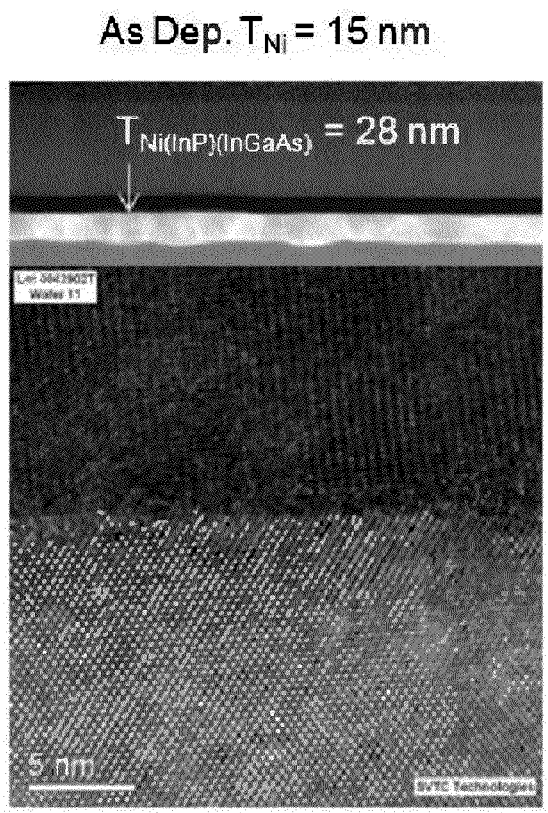
Figure 5B:
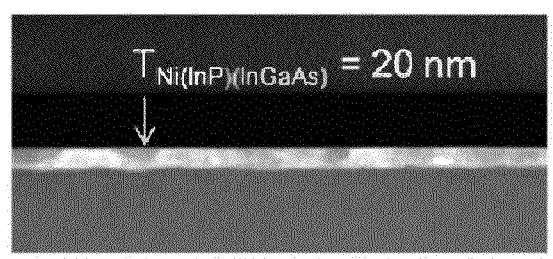

In some embodiments, the semiconductor structure comprises a self-aligned M(InP)(InGaAs) source/drain (S/D) contact, such as a Ni(InP)(InGaAs) S/D contact, disposed over the III-V source structure and the III-V drain structure (for example, InGaAs S/D structures), wherein the interfaces between said source and drain structures, and said M(InP)(InGaAs) S/D contact are substantially planar. The M(InP)(InGaAs) S/D contact may be any desired thickness. In certain embodiments, the S/D contact is 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 nm thick, including any and all ranges and subranges therein (e.g., 2-50 nm, 3-40 nm, 4-30 nm, 5-25 nm, etc.). FIGS. 5A-C depict semiconductor structures according to the present invention having Ni(InP)(InGaAs) contacts that are 10 nm, 20 nm, and 28 nm thick.

In some embodiments, Ni—Ga clusters are absent from the M(InP)(InGaAs) layer or S/D contact (for example, the Ni(InP)(InGaAS) layer or S/D contact) of the present invention.

In a first method aspect, the invention relates to a method of fabricating a semiconductor structure.

In some embodiments, the method of fabricating a semiconductor structure affords a semiconductor structure having a more abrupt interface than a semiconductor structure fabricated without an InP interlayer between a III-V semiconductor substrate and a metal layer.

In a second method aspect, the invention relates to a method of reducing interface roughness and/or sheet resistance (sheet resistivity) of a contact at elevated temperatures.

Figure 6:
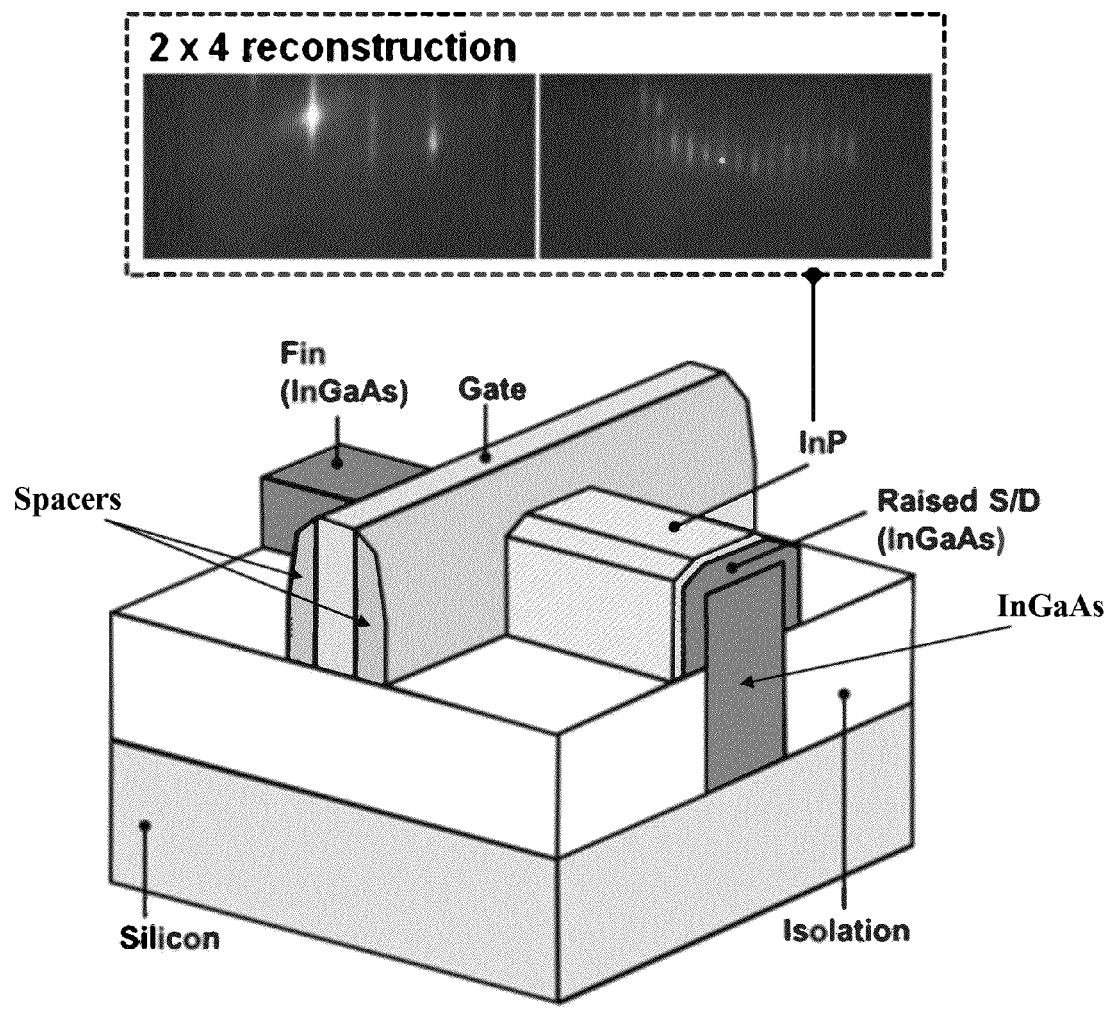
FIG. 6 is one embodiment of an intermediate semiconductor structure according to the present invention, prior to deposition of a metal layer and prior to annealing to form a metal alloy (M(InP)(III-V) layer.

In both the first and second method aspects, the methods include: providing a III-V semiconductor substrate; depositing an InP interlayer on the III-V semiconductor substrate; depositing a metal layer on the InP interlayer, wherein the metal layer comprises one or more of Ni, Pt, Pd, Co, Ti, Zr, Y, Mo, Ru, Ir, Sb, In, Dy, Tb, Er, Yb, and Te; and annealing. FIG. 6 shows one embodiment of an intermediate semiconductor structure according to the present invention, after the InP interlayer is deposited, but prior to deposition of the metal layer. To allow for visualization of the Fin, one of the S/D structures is shown without an InP layer. However, in various embodiments the InP interlayer is disposed over both S/D structures.

In some embodiments, the III-V semiconductor substrate used in the methods of the invention is an InGaAs substrate. While the III-V semiconductor substrate may be any desired thickness, in some embodiments, the III-V semiconductor substrate is 5 nm to 500 nm thick, for example, 5, 10, 15, 20, 25, 30, 35, 40, 45, 50, 55, 60, 65, 70, 75, 80, 85, 90, 95, 100, 105, 110, 115, 120, 125, 130, 135, 140, 145, 150, 155, 160, 165, 170, 175, 180, 185, 190, 195, 200, 205, 210, 215, 220, 225, 230, 235, 240, 245, 250, 255, 260, 265, 270, 275, 280, 285, 290, 295, 300, 305, 310, 315, 320, 325, 330, 335, 340, 345, 350, 355, 360, 365, 370, 375, 380, 385, 390, 395, 400, 405, 410, 415, 420, 425, 430, 435, 440, 445, 450, 455, 460, 465, 470, 475, 480, 485, 490, 495, or 500 nm, including any and all ranges and subranges therein (for example, 50 nm to 350 nm, or 100 nm to 300 nm thick).

The InP interlayer and the metal layer may also be any desired thickness. However, in some embodiments, the InP interlayer is 1, 2, 3, 4, 5, 6, 7, 8, 9, 10, 11, 12, 13, 14, 15, 16, 17, 18, 19, or 20 nm thick, including any and all ranges and subranges therein (e.g., 3-20 nm, 3-15 nm, 4-10 nm, etc.). In some embodiments, the metal layer is 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 nm thick, including any and all ranges and subranges therein (e.g., 3-30 nm, 3-15 nm, etc.).

In some embodiments, the InP interlayer is doped with any desirable dopant, including, but not limited to, S, Se, Te, Ge, Sn, O and combinations thereof. In some embodiments, InP layer is 0.5 nm to 25 nm thick, for example, 0.5, 1, 1.5, 2, 2.5, 3, 3.5, 4, 4.5, 5, 5.5, 6, 6.5, 7, 7.5, 8, 8.5, 9, 9.5, 10, 10.5, 11, 11.5, 12, 12.5, 13, 13.5, 14, 14.5, 15, 15.5, 16, 16.5, 17, 17.5, 18, 18.5, 19, 19.5, 20, 20.5, 21, 21.5, 22, 22.5, 23, 23.5, 24, 24.5, or 25 nm thick, including any and all ranges and subranges therein (e.g., 3-20 nm, 5-15 nm, etc.). In some embodiments, the InP layer is at least 1 nm thick.

In some embodiments, the metal layer is a nickel layer, meaning a layer which comprises nickel. In certain embodiments, the nickel layer consists of nickel or consists of one or more of Ni, Pt, Pd, Co, Ti, Zr, Y, Mo, Ru, Ir, Sb, In, Dy, Tb, Er, Yb, and Te. In some embodiments, the one or more of Ni, Pt, Pd, Co, Ti, Zr, Y, Mo, Ru, Ir, Sb, In, Dy, Tb, Er, Yb, and Te in the metal layer constitutes at least 3 weight % of the metal layer.

In some embodiments, an additional layer is deposited on the metal layer before annealing. For example, in some embodiments, the additional layer may be $SiO_2$, SiN, TiN, HfN, or TaN.

The annealing step of the present invention may be carried out at any desirable temperature Annealing is commonly carried out in an inert atmosphere such as argon, at temperatures from 300° C. to 1100° C. In certain embodiments the substrate may be annealed at a temperature between 400° C. and 1000° C. for a period of 10 seconds to 60 minutes. In some embodiments, it is annealed between 400° C. and 600° C. for a period of 10 seconds to 5 minutes. The expression "from 300° C. to 1100° C." (and analogously other ranges)

means that the process is carried out either by maintaining any temperature between 300° C. and 1100° C. or by varying the temperature within that range. In some embodiments, the annealing is carried out at a temperature of 250° C. to 800° C., for example, 250, 275, 300, 325, 350, 375, 400, 425, 450, 475, 500, 525, 550, 575, 600, 625, 650, 675, 700, 725, 750, 775, or 800° C., including any and all ranges and subranges therein (e.g., 250° C. to 600° C., 400° C. to 500° C., or 425° C. to 475° C.). In some embodiments, the annealing is carried out at a temperature of greater than or equal to 400° C. While various annealing steps may be performed on semiconductor structures of the present invention, the annealing step referred to herein is performed after the InP interlayer has been deposited on the III-V substrate, and after the metal layer has been deposited on the InP interlayer. In some embodiments, no additional annealing steps are performed between the deposition of the InP interlayer and the deposition of the metal layer. During the annealing step, a metal alloy M(InP)(III-V) is formed by reaction of at least a portion of the III-V semiconductor substrate together with the InP interlayer and the metal layer. For example, where the semiconductor substrate is an InGaAs substrate and the metal layer is a nickel layer, the metal alloy formed during annealing is a Ni(InP)(InGaAs) alloy, which may additionally comprise any dopant atoms. In some embodiments, the metal alloy is a S/D contact, which may be formed on the source and drain structures of a semiconductor structure.

In some embodiments, a two step anneal process is used for the reaction of Ni with the InP interlayer to limit excessive Ni(InP)—InGaAs formation. For example, a first anneal may be performed between 250-300° C. Remaining metal may be selectively removed before a second anneal step. In some embodiments, the second anneal step is carried out at a temperature higher than the first temperature, for example, at a temperature of 350° C. or more, for example, 350, 375, 400, 425, 450, 475, 500, 525, 550, 575, 600, 625, 650, 675, 700, 725, 750, 775, or 800° C. or more, including any and all ranges and subranges therein.

In certain embodiments, the reaction of a metal, such as Ni, with the InP interlayer during annealing allows for the formation of a uniform metal(III-V) alloy with an abrupt interface to III-V semiconductor (e.g., InGaAs), which enables the formation of ultra-thin metal(InP)(III-V) alloy films. The formation of a uniform metal(InP)(III-V) alloy with an abrupt interface to III-V FinFETs and/or UTB FETs, for example, can improve device performance due to a reduction in process variation (e.g., contact resistance, junction leakage) and/or maintain stress levels in the S/D stressors for maximizing strain in III-V devices. Further, the uniform alloy and/or abrupt alloy/III-V interface can enable one to control the thickness of the alloy, and to fabricate an ultra-thin metal(InP)(III-V) alloy layer.

The use, construction and fundamental operation of reaction chambers for implantation, for deposition of films and for annealing are understood by those of ordinary skill in the art of semiconductor fabrication. The present invention may be practiced on a variety of such reaction chambers without undue experimentation. Furthermore, one of ordinary skill in the art will comprehend the necessary detection, measurement, and control techniques in the art of semiconductor fabrication upon reading the disclosure.

The term substrate, as used in the foregoing and following descriptions, includes any structure having an exposed surface with which to form an integrated circuit (IC) structure. The term substrate is understood to include semiconductor wafers. The term substrate is also used to refer to semiconductor structures during processing, and may include other layers that have been fabricated thereupon.

Several embodiments of the invention are described in the examples below. Example A: Fabrication of InGaAs n-MOSFET with self-aligned Ni(InP)(InGaAS) contact.

InGaAs substrate was grown on Si substrate, and was cleaned by HCl, $NH_4OH$, A 1 nm/5 nm $Al_2O_3$/$ZrO2$ bilayer stack deposited by ALD at 250° C. was used as the gate dielectric. Subsequently, 100 nm TiN was deposited as the metal gate with physical vapor deposition. The gate hardmask was 20 nm of PECVD $SiO_2$. 193 nm lithography was then used to pattern the high-k/metal gate stack. The S/D regions were formed by $Si^+$ implant. Silicon oxynitride (SiON) spacers, which prevent the S/D structures from electrically contacting the gate sidewalls, were formed to cover the side wall of the gate stack for subsequent selective InGaAs MOCVD epitaxy process to form raised S/D structures.

A 5 nm InP interlayer was epitaxially grown on the InGaAs S/D at 420° C. with ambient, P overpressure VIII ratio>1. The structure was cleaned in a dilute HF (1:100 HF:$H_2O$) solution for 30 seconds, and was rinsed and dried. 5 nm of Ni were blanket deposited by physical vapor deposition over the InP interlayer and remaining upper portion of the structure. The structure was annealed in flowing $N_2$ environment at 400° C. for 30-60 seconds to form Ni(InP)(InGaAs) alloy S/D contact. Unreacted Ni was selectively removed (for example, from the gate) using HCl:$H_2O$ for 60 seconds at 90° C.

Counterexample A2: Fabrication of InGaAs n-MOSFET with Ni—InGaAs contact.

Using the same process as described in Example A, except omitting the InP layer, an InGaAs n-MOSFET having an Ni—InGaAs layer (as opposed to the Ni(InP)(InGaAs) layer of Example A) according to the prior art was fabricated.

FIGS. 2A-B are XTEM micrograph images of a semiconductor structure according to the present invention formed according to Example A, above. FIGS. 2C-D are semiconductor structures according to Counterexample A2, above, the preparation of which did not include an InP interlayer. FIGS. 2B and 2D are close-up micrograph images of the metal alloy/III-V interfaces for the semiconductor structures of Example A and Counterexample A2, respectively. FIG. 2E depicts comparative micrograph images, with a micrograph image of the semiconductor structure of Example A shown under a micrograph image of the semiconductor structure of Counterexample A2. As is clear from FIGS. 2A-B and 2E (bottom), the insertion of an InP interlayer resulted in the formation of a uniform metal alloy layer with a substantially planar alloy-semiconductor interface, whereas the semiconductor structure representative of the prior art had a rough interface. HRTEM further revealed that the interface is highly oriented and abrupt for the metal alloy formed in presence of the InP interlayer. The black layers and the gray layers immediately above the black layers in the images are electron beam deposited carbon and Pt, respectively. They are part of the TEM sample prep, and do not relate to the invention.

Figure 3A:
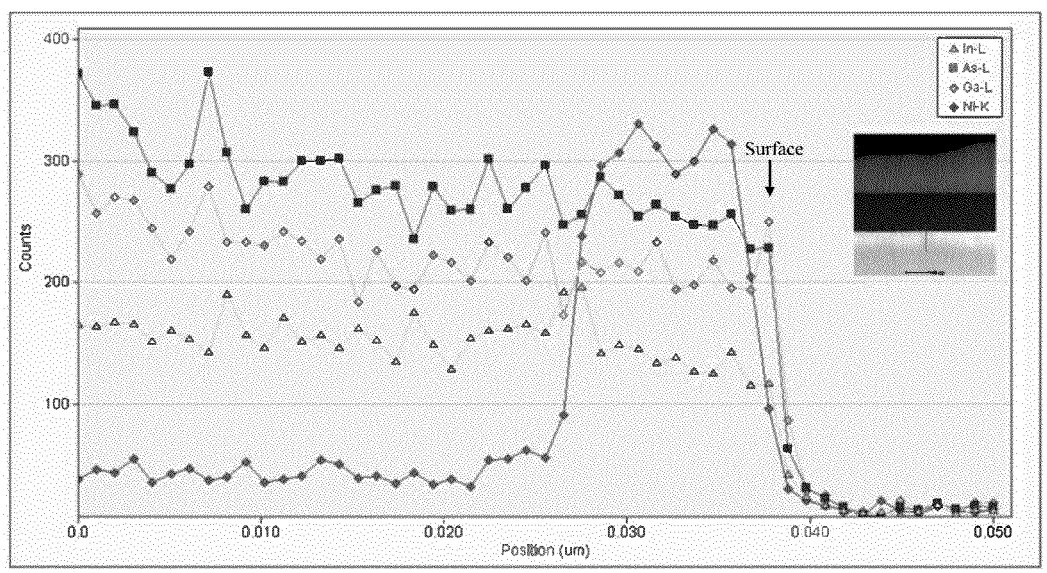
FIGS. 3A-B are plots showing the results of EDS analyses (1 nm spot size).
Figure 3B:
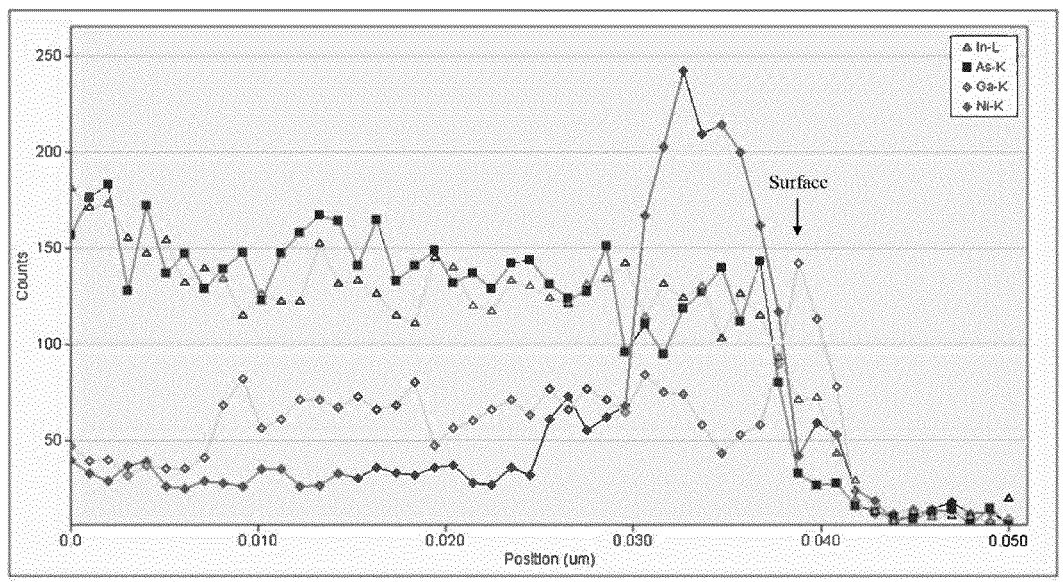

Without wishing to be held to this rationalization, the rough metal alloy/III-V interface of prior art semiconductor structures such as Counterexample A2 are believed to be caused, at least in part, by the excessive diffusion of Ni and/or an accumulation of undesirable compounds on the surface of the metal(III-V) alloy resulting from out-diffusion of Ga and As. FIGS. 3A-B are plots showing the results of EDS analyses on the semiconductor structures of Example A and Counterexample A2, respectively. The inset of FIG. 3A shows the direction of the EDS scan direction for both 3A and 3B. The FIG. 3B plot shows an accumulation of a Ni—Ga compound on the surface of the Ni—InGaAs alloy, whereas FIG. 3A shows that Ga and As out-diffusion was suppressed in Example A, which included an InP interlayer. When the Ni—Ga compounds are present in prior art semiconductor structures, selective wet removal of Ni causes etching of the Ni—Ga compounds, resulting in a discontinuous metal(III-V) alloy, which can be detrimental to device performance. The addition of an InP interlayer inhibits the out-diffusion of As, which may enable a more robust selective Ni removal process for device integration as Ni—Ga is not present. Accordingly, in certain embodiments, the invention also enables a more robust selective wet etch process due to the absence of Ga/As decomposition from the alloy surface.

Examples B, C, D, E, and F

Examples B, C, D, E, and F were prepared using the same process as described in Example A, except different annealing temperatures (250° C., 300° C., 350° C., 450° C., and 500° C., respectively) were used to form the Ni(InP)(InGaAs) alloy.

Counterexamples B2, C2, D2, E2, and F2.

Counterexamples B2, C2, D2, E2, and F2 were prepared using the same process as for Counterexample A2, except different annealing temperatures (250° C., 300° C., 350° C., 450° C., and 500° C., respectively) were used to form the Ni—InGaAs alloy.

Figure 4:
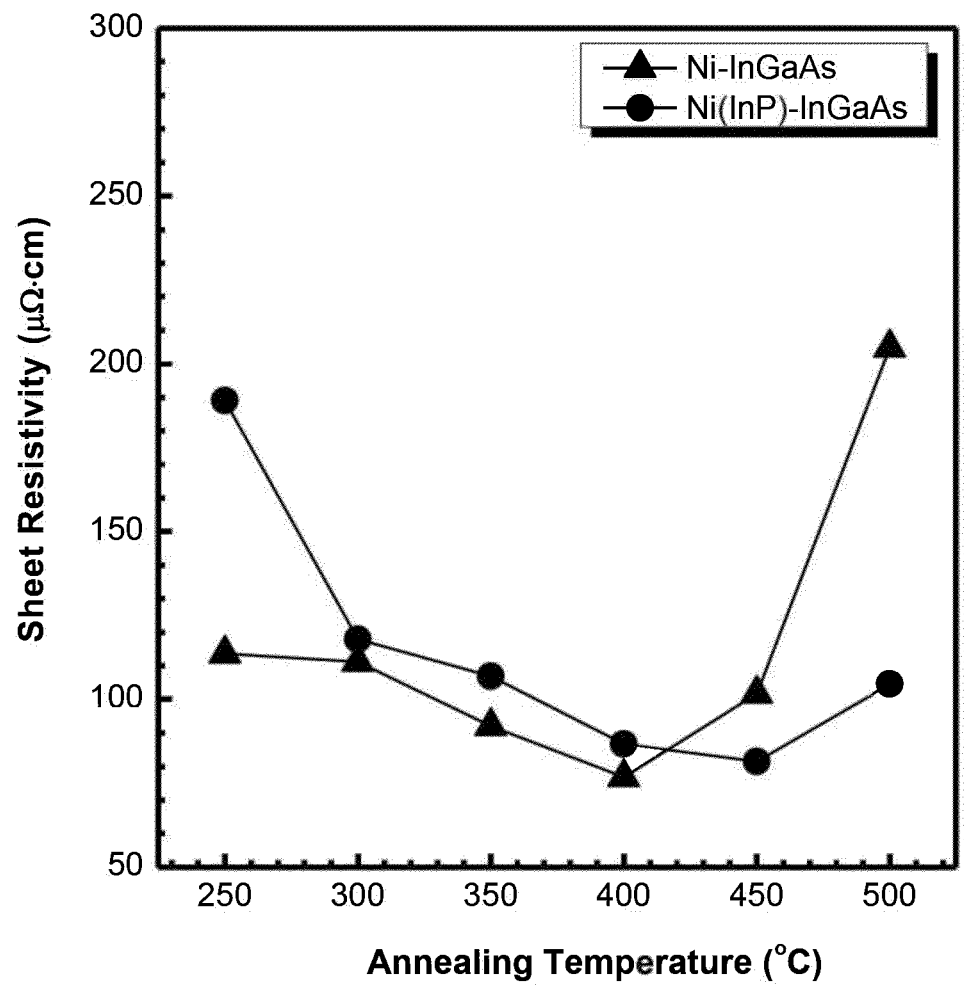
FIG. 4 is a plot showing comparative sheet resistance ($R_s$) values for semiconductor structures fabricated with an InP interlayer according to the present invention versus semiconductor structures fabricated without an InP interlayer, annealed at various temperatures.

FIG. 4 is a plot showing comparative sheet resistivity ($R_{sheet}$) values for Examples A-F according to the present invention (fabricated with an InP interlayer) versus Counterexamples A2-F2 (fabricated without an InP interlayer). As is evident from FIG. 4, the metal(III-V) alloys formed with a 5 nm InP layer all had comparable $R_{sheet}$ values to that of metal(III-V) alloys formed on InGaAs without an InP interlayer. However, at temperatures greater than 400° C., it is evident that the metal(III-V) alloys formed with a 5 nm InP layer have a lower $R_{sheet}$ value than the corresponding metal (III-V) alloys formed on InGaAs without an InP layer. This is attributed to the higher morphological stability of the semiconductor structures and methods of the present invention.

Examples G and H

Examples G and H were prepared using the same process as described in Example A, except that 10 nm and 15 nm of Ni, respectively for Example G and Example H, were deposited instead of 5 nm of Ni.

Figure 5D:
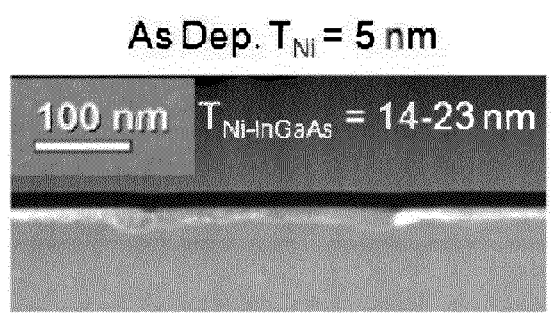

FIGS. 5A-D are XTEM micrograph images of metal/III-V interfaces in semiconductor structures. FIG. 5A corresponds to the semiconductor structure of Example A, whereas FIGS. 5B and 5C correspond to Example G and Example H, respectively. FIG. 5D is an image of a portion of the semiconductor structure fabricated in Counterexample A2. FIGS. 5A-C demonstrate that the metal/III-V interface remained smooth even at a metal(InP)(III-V) alloy thickness of 28 nm, which is considerably thicker than the 5 nm InP interlayer thickness. FIG. 5D demonstrates that even at a Ni thickness of 5 nm, the metal/III-V interface of the semiconductor structure fabricated without an InP layer is non-planar with significant variations in the alloy thickness (14-23 nm).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

While several aspects and embodiments of the present invention have been described and depicted herein, alternative aspects and embodiments may be affected by those skilled in the art to accomplish the same objectives. Accordingly, this disclosure and the appended claims are intended to cover all such further and alternative aspects and embodiments as fall within the true spirit and scope of the invention.

The invention claimed is:

1. A semiconductor structure comprising a first layer comprising an n-type III-V semiconductor material and a second layer comprising M(InP)(InGaAs) alloy, wherein M is selected from Ni, Pt, Pd, Co, Ti, Zr, Y, Mo, Ru, Ir, Sb, In, Dy, Tb, Er, Yb, and Te, and combinations thereof, said semiconductor structure having an interface between said first and second layers wherein said interface is substantially planar.

2. The semiconductor structure according to claim 1, wherein the first layer is an InGaAs layer.

3. The semiconductor structure according to claim 1, wherein the second layer is a Ni(InP)(InGaAs) alloy.

4. The semiconductor structure according to claim 1 having an InGaAs source structure and an InGaAs drain structure, and a self-aligned Ni(InP)(InGaAs) source/drain (S/D) contact disposed over the source structure and the drain structure, wherein the interfaces between said InGaAs source and drain structures, and said Ni(InP)(InGaAs) S/D contact are substantially planar.

5. The semiconductor structure according to claim 4, having an embedded source structure and an embedded drain structure.

6. The semiconductor structure according to claim 4, having a raised source structure and a raised drain structure.

7. The semiconductor structure according to claim 4, wherein the Ni(InP)(InGaAs) source/drain (S/D) contact is 5-30 nm thick.

8. The semiconductor structure according to claim 4, further comprising an InP layer.

9. The semiconductor structure according to claim 4, wherein Ni—Ga compounds are absent from the Ni(InP)(InGaAs) source/drain (S/D) contact.

10. A method of fabricating a semiconductor structure, said method comprising:
   providing a III-V semiconductor substrate;
   depositing an InP interlayer directly on the III-V semiconductor substrate;
   depositing a metal layer directly on the InP interlayer, wherein the metal layer comprises one or more of Ni, Pt, Pd, Co, Ti, Zr, Y, Mo, Ru, Ir, Sb, In, Dy, Tb, Er, Yb, and Te; and
   annealing.

11. The method according to claim 10, wherein the III-V semiconductor substrate is an InGaAs substrate.

12. The method according to claim 10, wherein the metal layer is a nickel layer.

13. The method according to claim 10, wherein the III-V semiconductor substrate is an InGaAs substrate, and the metal layer is a nickel layer.

14. The method according to claim 13, wherein the InP interlayer is 3-20 nm thick, and the nickel layer is 3-20 nm thick.

15. The method according to claim 14 wherein the annealing is performed at a temperature of 250° C. to 500° C.

16. A method of reducing interface roughness and/or sheet resistance of a contact ($R_S$), said method comprising:
   providing a III-V semiconductor substrate;
   depositing an InP interlayer directly on the III-V semiconductor substrate;
   depositing a metal layer directly on the InP interlayer, wherein the metal layer comprises one or more of Ni, Pt, Pd, Co, Ti, Zr, Y, Mo, Ru, Ir, Sb, In, Dy, Tb, Er, Yb, and Te; and
   annealing.

17. The method according to claim 16 wherein the metal layer is a nickel layer.

18. The method according to claim 17, wherein the InP inter layer is 1-15 nm thick, and the nickel layer is 3-15 nm thick.

19. The method according to claim 18 wherein the annealing is performed at a temperature of 250° C. to 500° C.

* * * * *